(12) United States Patent
Sinha et al.

(10) Patent No.: US 8,282,999 B2
(45) Date of Patent: Oct. 9, 2012

(54) SPIN-ON FILM PROCESSING USING ACOUSTIC RADIATION PRESSURE

(75) Inventors: Nishant Sinha, Boise, ID (US); Gurtej S. Sandhu, Boise, ID (US); John Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1223 days.

(21) Appl. No.: 12/098,124

(22) Filed: Apr. 4, 2008

(65) Prior Publication Data
US 2009/0253271 A1    Oct. 8, 2009

(51) Int. Cl.
B05D 3/06    (2006.01)
B01J 19/10   (2006.01)
B06B 1/00    (2006.01)
H01L 21/31   (2006.01)

(52) U.S. Cl. ........ 427/560; 427/600; 427/240; 427/346; 118/620; 118/640; 118/52; 118/56; 438/780; 438/782

(58) Field of Classification Search .................. 427/240, 427/425, 346, 560, 600; 118/52, 320, 56, 118/620, 640; 438/758, 782
See application file for complete search history.

(56) References Cited

U.S. PATENT DOCUMENTS

| 4,996,080 | A  | * | 2/1991  | Daraktchiev ................. 427/600 |
| 6,019,844 | A  | * | 2/2000  | Chiu ............................... 118/52 |
| 6,029,518 | A  |   | 2/2000  | Oeftering |
| 6,090,295 | A  |   | 7/2000  | Karumanchi |
| 6,216,538 | B1 |   | 4/2001  | Yasuda |
| 6,402,403 | B1 |   | 6/2002  | Speakman |
| 6,583,071 | B1 |   | 6/2003  | Weidman et al. |
| 6,612,686 | B2 |   | 9/2003  | Mutz |
| 6,627,263 | B2 | * | 9/2003  | Kitano et al. ................. 427/346 |
| 6,635,113 | B2 | * | 10/2003 | Takamori et al. ............. 118/681 |
| 6,726,964 | B1 |   | 4/2004  | Thompson |
| 7,138,014 | B2 |   | 11/2006 | Stevens |
| 7,340,957 | B2 |   | 3/2008  | Kaduchak |
| 7,371,434 | B2 | * | 5/2008  | Ito ................................. 427/425 |
| 2006/0021437 | A1 |   | 2/2006  | Kaduchak |

FOREIGN PATENT DOCUMENTS

JP    2004-130309 A  *  4/2004
WO    WO-2004114386      12/2004

OTHER PUBLICATIONS

JPO computer translation of JP 2004-130309 A, published Apr. 2004.*

* cited by examiner

*Primary Examiner* — Kirsten Jolley
(74) *Attorney, Agent, or Firm* — Schwegman, Lundberg & Woessner, P.A.

(57) ABSTRACT

An apparatus and process operate to impose sonic pressure upon a spin-on film liquid mass that exhibits a liquid topography and in a solvent vapor overpressure to alter the liquid topography. Other apparatus and processes are disclosed.

27 Claims, 5 Drawing Sheets

SPIN-ON FILM PROCESSING USING ACOUSTIC RADIATION PRESSURE

BACKGROUND

During semiconductor device fabrication processes, spin-on films are formed upon semiconductive wafers. Film thickness and uniformity are process variables.

BRIEF DESCRIPTION OF THE DRAWINGS

The present disclosure addresses spin-on film uniformity and thickness issues, and will be understood by reading and studying the following specification, of which the figures are a part.

DETAILED DESCRIPTION

The embodiments of a device, an apparatus, or an article described herein can be manufactured, used, or shipped in a number of positions and orientations. Some will be shown below, and numerous others will be understood by those of ordinary skill in the art upon reading the following disclosure.

Figure 1:
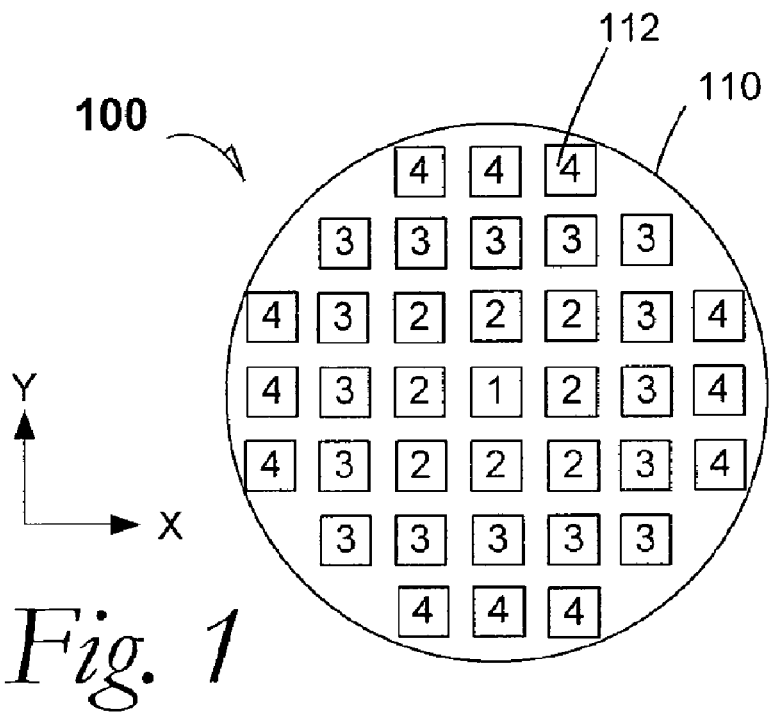
FIG. 1 shows a top plan view of a plurality of acoustic radiation pressure broadcast sources disposed in an array according to an embodiment.

FIG. 1 shows a top plan view of a plurality of acoustic radiation pressure (ARP) broadcast sources disposed in an array 100 according to an embodiment. The array 100 includes a mounting substrate 110 and a plurality of ARP broadcast sources, one of which is designated with numeral 112. The array 100 may have a substantially circular form factor with a diameter that is large enough to approximate the size of a semiconductive wafer during wafer processing.

Figure 2A:
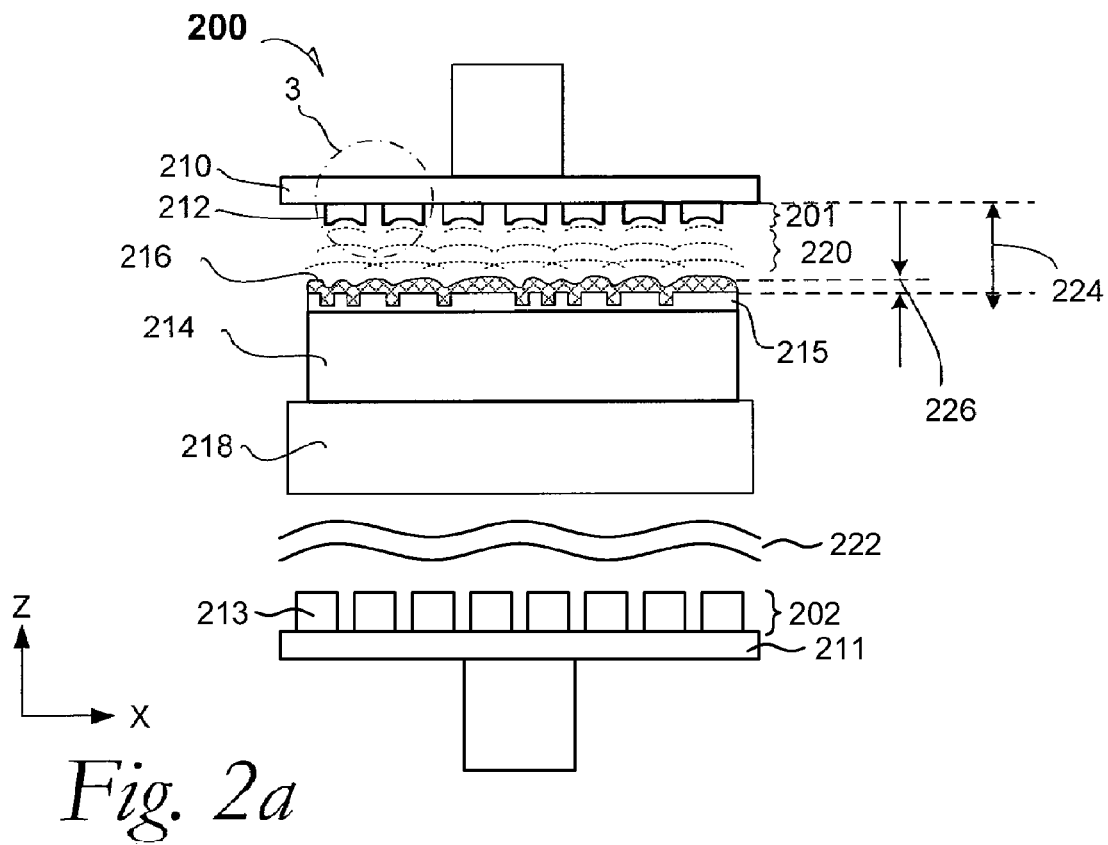
FIG. 2 shows a cross-section elevation of a semiconductive wafer during spin-on processing that uses acoustic radiation pressure on the spin-on mass according to an embodiment.

FIG. 2a shows a cross-section elevation 200 of a semiconductive wafer 214 during spin-on processing that uses acoustic radiation pressure on a spin-on mass 216 according to an embodiment. For illustrative purposes, a device and metallization layer 215 is depicted below a spin-on mass 216. The spin-on mass 216 is depicted with an exaggerated irregular upper surface for illustrative purposes. The spin-on mass 216 tends to form depressions above depressions in the device and metallization layer 215 and it tends to from prominences above prominences in the device and metallization layer 215. A measurement between the bottom of a depression and the top of an adjacent prominence is referred to as a step height.

A plurality of ARP broadcast sources are disposed in a first array 201. The first array 201 includes a mounting substrate 210 and a plurality of ARP broadcast sources, one of which is designated with reference numeral 212.

The semiconductive wafer 214 is disposed upon a spinner 218. A second array 202 of ARP broadcast sources are disposed on a mounting substrate 211, and one of the sources is designated with reference numeral 213.

As depicted, the spin-on mass 216 on the semiconductive wafer 214 exhibits a spin-on film liquid topography. The liquid topography is shown with an arbitrary shape and size for illustrative purposes. The arbitrary shape and size is exhibited in the "head space" between the top of the spin-on mass 216 and the ARP broadcast sources 212. Because of the small geometries of the thickness of the spin-on mass, the entirety of the spin-on mass 216 may be affected by boundary layer effects.

In an embodiment, the spin-on mass 216 is a glass material. In an embodiment, the spin-on mass 216 is a masking material. In an embodiment, the spin-on mass 216 is an interlayer dielectric material.

FIG. 2a also depicts acoustic radiation pressure as emanating waves 220 and 222 being sourced from the respective arrays 201 and 202. In a process embodiment, the spin-on mass 216 is dispensed onto the semiconductive wafer 214 while the spinner 218 is being rotated. Both the first array 201 and the second array 202 of acoustic radiation pressure broadcast sources 212, 213 are active to alter the liquid topography of the spin-on mass 216. In an embodiment, only one of the first array 201 or the second array 202 of ARP broadcast sources 212, 213 is used to assist in altering the liquid topography of the spin-on mass 216.

In an embodiment, the first array 201 is used to alter the liquid topography of the spin-on mass 216, in addition to use of the spinner 218. In an embodiment, the first array 201 provides ultrasonic acoustic radiation, defined as a frequency up to about 900 kHz. In an embodiment, the first array 201 emanates megasonic acoustic radiation, defined as a frequency above about 900 kHz, to about 2 MHz. Modulating of the ARP may include changing either of the frequency or of the amplitude thereof. Modulating of the ARP may include changing the uniformity of the ARP from a uniform pulse to an asymmetrical pulse.

In an embodiment, the first array 201 is spaced apart and above the spin-on mass 216 by a spacing distance 224 that is related to the diameter of a given ARP broadcast source 212. In an embodiment, a 13-inch wafer 214 is processed with about 52 ARP broadcast sources that may be arranged similarly to the array 100 depicted in FIG. 1. FIG. 1 depicts about 36 ARP broadcast sources 212.

In an embodiment, the spin-on mass 216 is processed within a closed tool and the tool is flooded with solvent vapors that are indigenous to the spin-on mass 216. Consequently, solvent within the spin-on mass 216 has a lowered driving force because of a lower solvent concentration gradient between the spin-on-mass and the environment. Consequently the solvent may be hindered in the process of escaping the spin-on mass 216 into the environment within the tool because of the overpressure placed on the solvent in the spin-on mass 216.

Figure 2B:
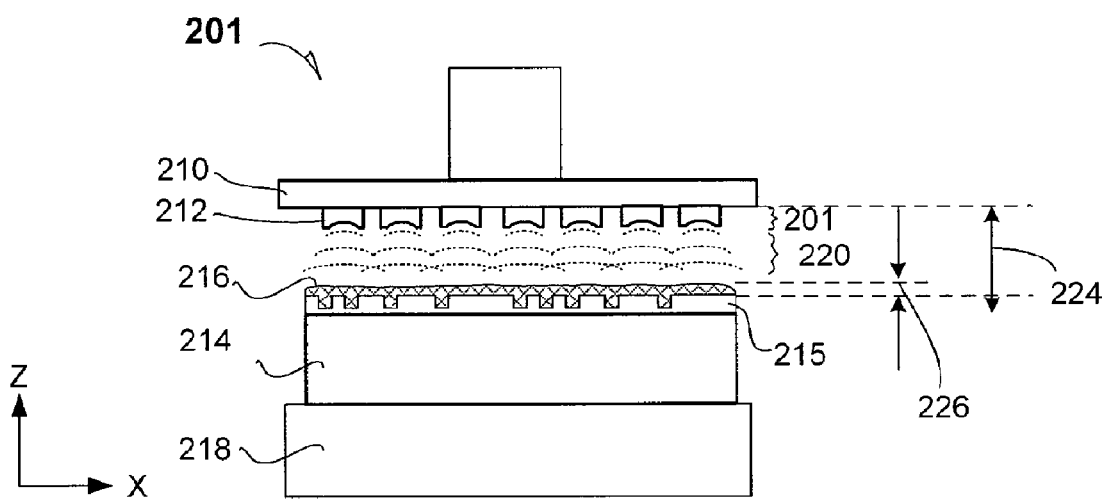

FIG. 2b shows a cross-section elevation 201 of the semiconductive wafer 214 during spin-on processing after further processing according to an embodiment. The spin-on mass 216 has been flattened such that the step height has been virtually eliminated. In this disclosure the term "virtually eliminated" with respect to step height in the spin-on mass means no discernable difference in unevenness can be determined between a region of no topography on a wafer surface and a region of device and metallization layer 215 topography where device and metallization exhibits topography steps.

Figure 3:
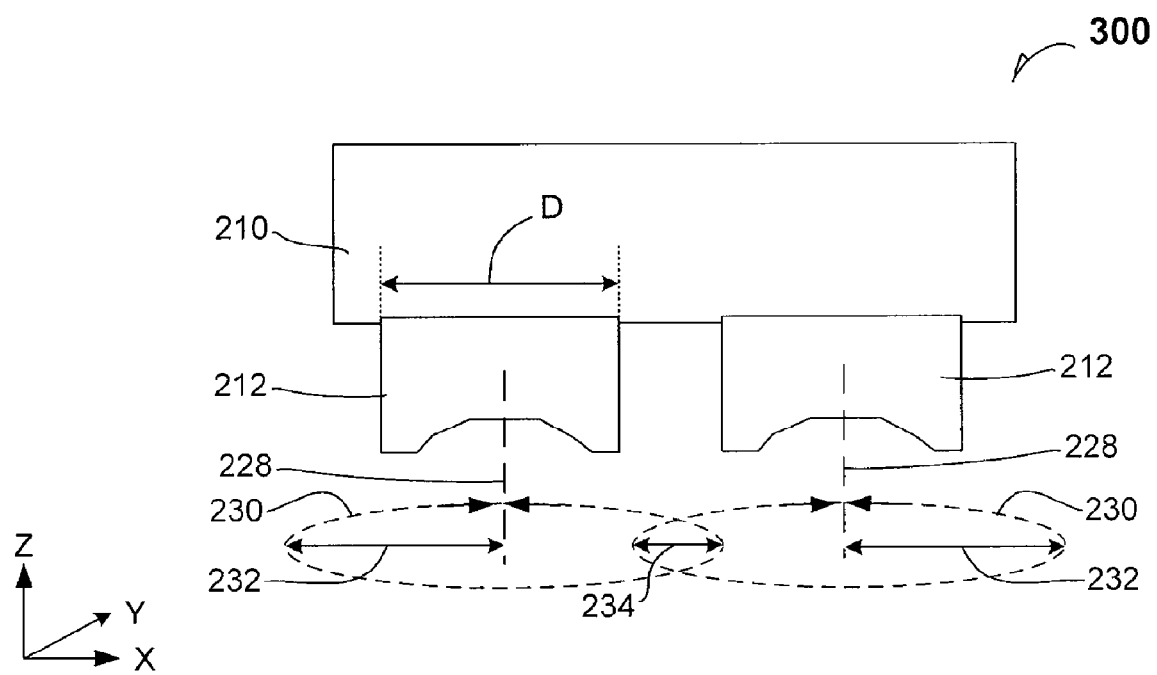
FIG. 3 is a detail of a portion of an acoustic radiation pressure source during spin-on processing according to an embodiment.

FIG. 3 is a detail of a portion of an acoustic radiation pressure source during spin-on processing according to an embodiment. The detail is taken from FIG. 2 at the section 3.

In an embodiment, the mounting substrate 210 is moved in an oscillatory motion relative to the spin-on material (not shown). FIG. 3 illustrates a lateral oscillatory motion in the X-Y plane. Each ARP broadcast source 212 is illustrated with a symmetry line 228. A dashed circular motion line 230 illustrates oscillatory motion. In an embodiment, the oscillatory motion is eccentric oscillatory. In an embodiment, the symmetry line 228 of a given ARP broadcast source 212 moves with an oscillatory motion such that an oscillatory radius 232 is achieved. In an embodiment, the oscillatory radius 234 is less than one half the characteristic diameter, D, of the given ARP broadcast source 212. In an embodiment, the oscillatory radius 232 is substantially equal to the characteristic diameter of the given ARP broadcast source 212. In an embodiment, the oscillatory radius 232 is greater than one half the characteristic diameter of the given ARP broadcast source 212.

In an embodiment, the oscillatory radius 232 is greater than one half the characteristic diameter of the given ARP broadcast source 212 and is large enough that the oscillatory motion of the ARP broadcast source 212 causes the symmetry line 228 of an ARP broadcast source 212 to intersect the dashed circular motion line 226 of a neighboring ARP broadcast source 212. The degree of intersection therebetween may be quantified by the intersection dimension 234. In an embodiment, the intersection dimension 234 is less than half the oscillatory radius 228.

Figure 4:
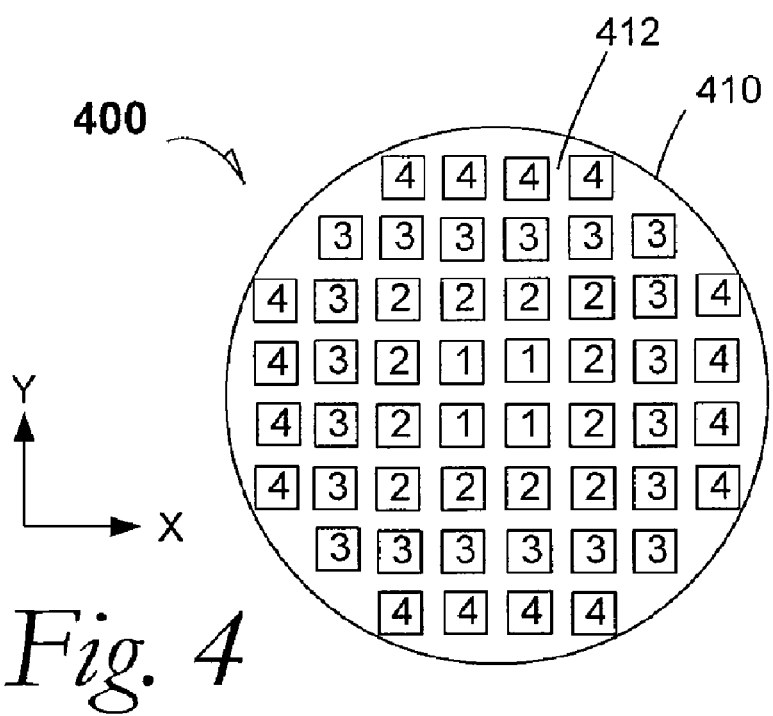
FIG. 4 shows a top plan view of a plurality of acoustic radiation pressure broadcast sources disposed in an array according to an embodiment.

FIG. 4 shows a top plan view of a plurality of ARP broadcast sources disposed in an array 400 according to an embodiment. The array 400 includes a mounting substrate 410 and a plurality of ARP broadcast sources, one of which is designated with numeral 412. The array 400 may have a substantially circular form factor with a diameter that is large enough to approximate the size of a semiconductive wafer during wafer processing. As depicted, the array 400 has about 52 ARP broadcast sources 412 that are spaced apart upon the mounting substrate 410.

Reference is made to either FIG. 1 or FIG. 4. In a process embodiment, the array includes a plurality of ARP broadcast sources. During the formation of spin-on liquid, the plurality of ARP broadcast sources is activated in the ultrasonic range to alter the liquid topography of the spin-on liquid.

In an embodiment, the array 100 is activated such that the broadcast source enumerated with numeral 1 is first activated and remains activated, followed by the broadcast sources enumerated with numerals 2, which surround the broadcast source enumerated with numeral 1. Next, the broadcast sources enumerated with numerals 3 are activated and remain activated. Finally the broadcast sources enumerated with numeral 4 are activated such that all broadcast sources are activated. Consequently, a center-to-edge radial smoothing force is imposed upon the spin-on liquid under conditions to alter the topography of the spin-on liquid.

In an embodiment, the aforementioned center-to-edge radial smoothing force is imposed upon the spin-on liquid at a first ultrasonic frequency, followed by a second center-to-edge radial smoothing force at a second ultrasonic frequency that is different than the first ultrasonic frequency. In an embodiment, the first ultrasonic frequency is lower than the second ultrasonic frequency.

In an embodiment, the entire array 100 is activated substantially simultaneously. In an embodiment, the entire array 100 is activated substantially simultaneously, at a first ultrasonic frequency, followed by altering the first ultrasonic frequency to a second frequency that is different from the first frequency. In an embodiment, the first ultrasonic frequency is lower than the second ultrasonic frequency.

In an embodiment, the array is activated at a sub-sonic frequency. The center-to-edge radial smoothing force is then applied. In an embodiment, the array is activated at an ultrasonic frequency, and the center-to-edge radial smoothing force is then applied.

In an embodiment, the array 400 is activated such that the broadcast sources enumerated with numerals 1 are first activated, followed by the broadcast sources enumerated with numerals 2, which surround the broadcast sources enumerated with numeral 1. Next, the broadcast sources enumerated with numerals 3 are activated. Finally the broadcast sources enumerated with numeral 4 are activated. Consequently, a center-to-edge radial smoothing force is imposed upon the spin-on liquid under conditions to alter the topography of the spin-on liquid.

In an embodiment, the entire array 400 is activated substantially simultaneously. In an embodiment, the entire array 400 is activated substantially simultaneously, at a first ultrasonic frequency, followed by altering the first ultrasonic frequency to a second frequency that is different from the first frequency. In an embodiment, the first ultrasonic frequency is lower than the second ultrasonic frequency.

In an embodiment, the entire array 400 is activated at a sub-sonic frequency. The center-to-edge radial smoothing force is then applied. In an embodiment, the entire array 400 is activated at an ultrasonic frequency, and the center-to-edge radial smoothing force is then applied.

In can now be appreciated that other smoothing schemes may be used, such as a traverse smoothing process that begins at one region of an ARP broadcast source array. For example, some of the ARP broadcast sources on the right-hand side of the array 400 may be activated, and then activation may traverse the face of the array 400 in a right-to-left fashion, instead of a center to edge fashion, as described previously. The traverse smoothing process may be repeated with different frequencies. It can also be appreciated that all disclosed embodiments may be carried out at megasonic frequencies.

Figure 5:
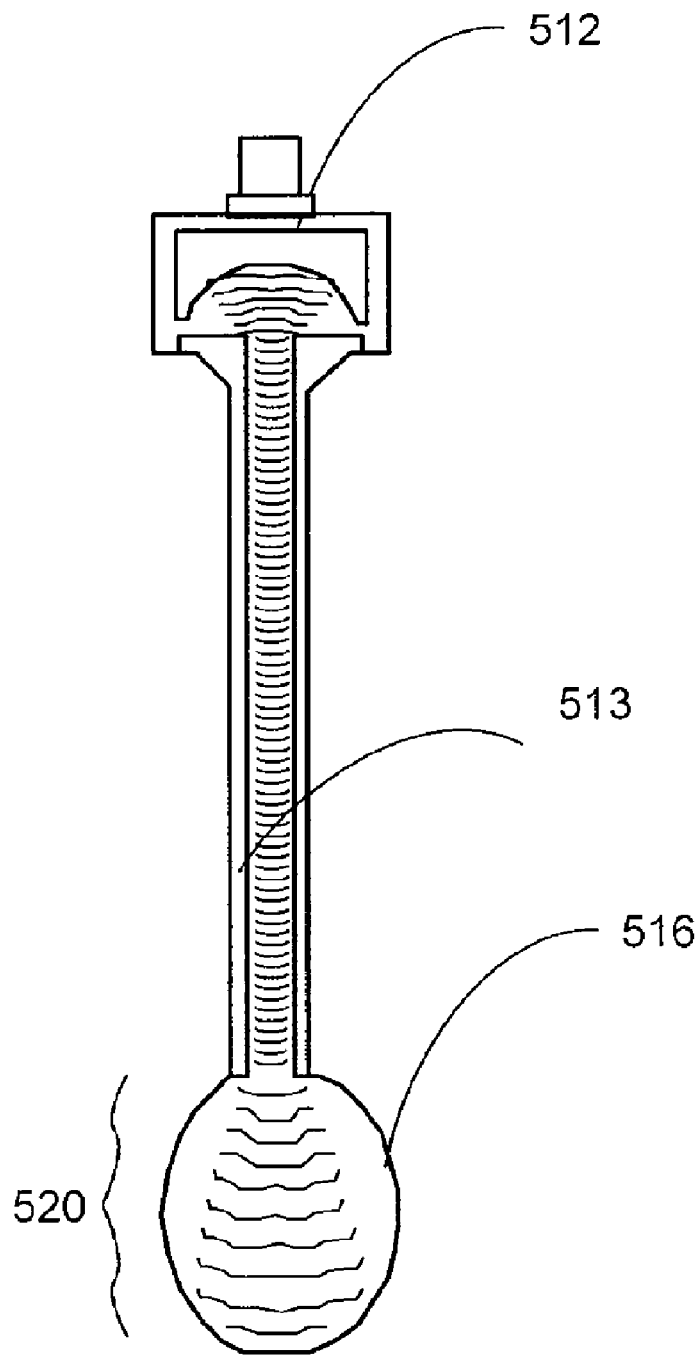
FIG. 5 is a cross-section elevation of a spin-on mass applier that uses acoustic radiation pressure during dispensing according to an embodiment.

FIG. 5 is a cross-section elevation of a spin-on mass applicator 500 that uses acoustic radiation pressure during dispensing according to an embodiment. The spin-on mass applicator 500 includes a transducer 512 that comprises an ARP broadcast source. A spin-on mass 516 forms as a droplet at the end of a syringe 513 that is affixed to the transducer 512. The spin-on mass 516 depicts acoustic radiation pressure as waves 520 emanating from the transducer 512 source. As the spin-on mass 516 leaves the syringe 513, it has been set into internal motion by virtue of acoustic waves generated by the transducer 512.

In an embodiment, the spin-on mass applicator 500 may be positioned above a semiconductive wafer that is being spun. The spin-on mass applicator 500 induces internal mixing motion within the spin-on mass 516 that alters the final topography of the spin-on mass as it spins onto the semiconductive wafer.

In an embodiment, the spin-on mass applicator 500 may be positioned at approximately the center of a mounting substrate such as the mounting substrate 110, the mounting substrate 210, or the mounting substrate 410. Accordingly, a space is made for the spin-on mass applicator 500. In an embodiment, a substantially centrally located ARP broadcast source is removed to allow a penetrating location for the spin-on mass applicator 500. In an embodiment, a plurality of spin-on mass applicators 500 may be positioned above the semiconductive wafer that is being processed.

In an embodiment, the spin-on mass applicator 500 and an array of ARP broadcast sources are used substantially simultaneously. Consequently, the spin-on mass 516 is first perturbed by the transducer 512, and second perturbed by at least one ARP broadcast sources, such as at least one of ARP broadcast sources 112, 212, 412 mounted upon one of the mounting substrate 110, the mounting substrate 210, or the mounting substrate 410.

In an embodiment, spin-on mass viscosity may be combined with spin rate and/or sonic frequency from the ARP broadcast source as variables. Further, saturation of a tool with a solvent that is soluble in the spin-on mass may be combined with spin rate and/or sonic frequency from the ARP broadcast source as variables.

Figure 6:
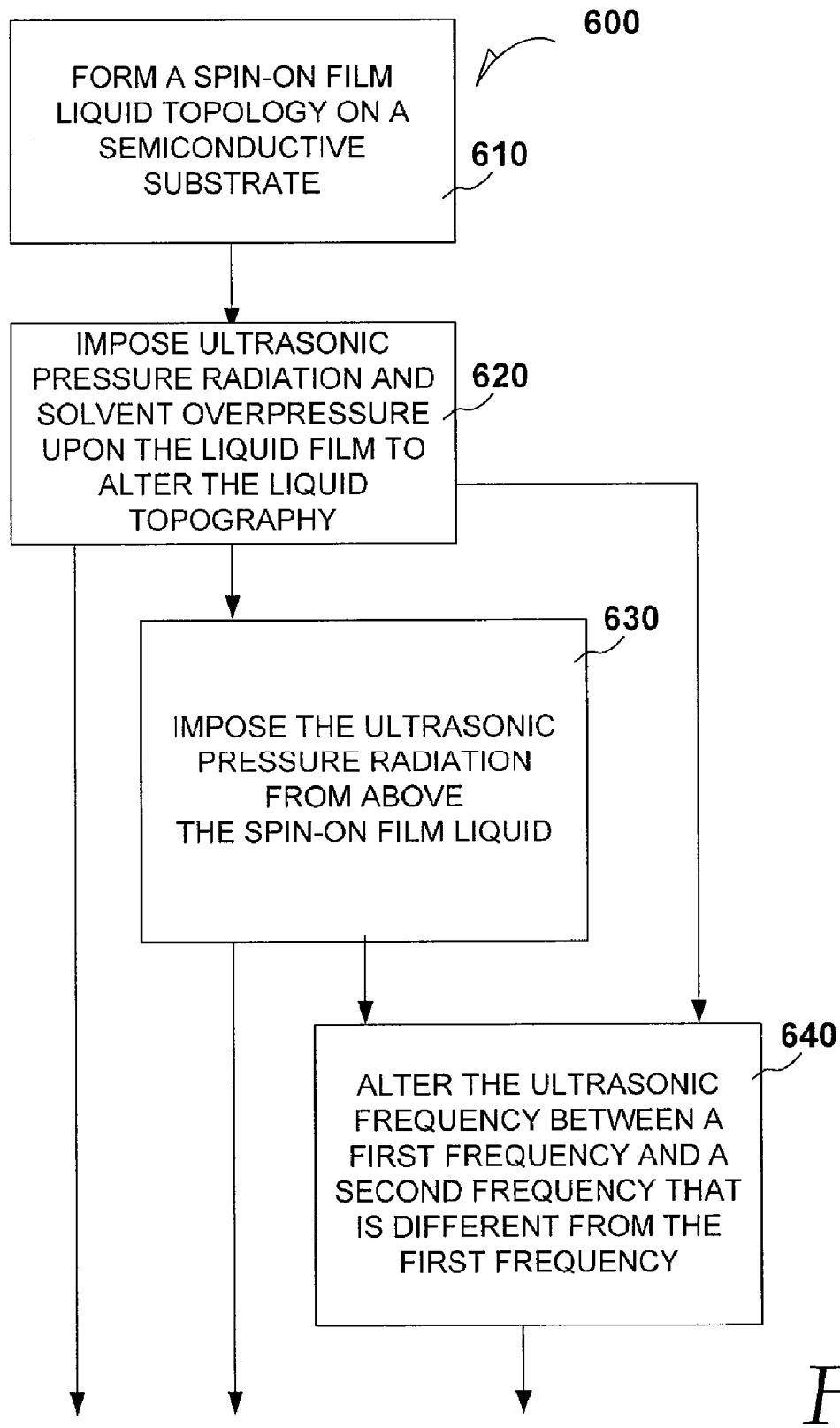
FIG. 6 is a process flow diagram according to an embodiment.

FIG. 6 is a process flow diagram according to an embodiment.

At block 610, the process 600 includes forming a spin-on film liquid topography upon a semiconductive substrate. Forming the spin-on film liquid topography can be carried out in a tool, wherein the spin-on film comprises a spin-on solder paste, and wherein the imposing a solvent vapor at an overpressure includes flushing the tool with a solvent vapor prior to forming the spin-on film. Forming the spin-on film liquid topography can be carried out in a tool, wherein the spin-on film comprises a spin-on photoresist, and wherein the imposing a solvent vapor positive pressure includes flushing the tool with a solvent vapor prior to forming the spin-on film. The semiconductive substrate can be moved laterally and the source can be moved eccentrically.

At 620, the process 600 includes imposing ultrasonic radiation pressure onto the spin-on film liquid topography under conditions to alter the liquid topography. Imposing sonic radiation pressure on the liquid topography can include broadcasting from the source while vertically oscillating the source relative to the liquid topography.

At 630, the process 600 includes imposing the ultrasonic radiation pressure from at least one of above and below the spin-on film liquid. The directions "above" and "below" are given with respect to FIG. 3 where the broadcast source 212 is above the spin-on film liquid that is in a gravity field, and the broadcast source 213 is below the spin-on film liquid that is also in the gravity field.

At 640, the process 600 includes altering the frequency from a first frequency to a second frequency, wherein the second frequency is different from the first frequency.

It should be noted that the methods and processes described herein do not have to be executed in the order described, or in any particular order. Thus, various activities described with respect to the methods identified herein can be executed in repetitive, simultaneous, serial, or parallel fashion.

This Detailed Description refers to the accompanying drawings that show, by way of illustration, specific embodiments in which the present disclosure may be practiced. These embodiments are described in sufficient detail to enable those skilled in the art to practice the disclosed embodiments. Other embodiments may be used and structural, logical, and electrical changes may be made without departing from the scope of the present disclosure. The various embodiments are not necessarily mutually exclusive, as some embodiments can be combined with one or more other embodiments to form new embodiments.

The Detailed Description is, therefore, not to be taken in a limiting sense, and the scope of this disclosure is defined only by the appended claims, along with the full scope of equivalents to which such claims are entitled.

The terms "wafer" and "substrate" used in the description include any structure having an exposed surface with which to form an electronic device or device component such as a component of an integrated circuit (IC). The term substrate is understood to include semiconductor wafers. The term substrate is also used to refer to semiconductor structures during processing and may include other layers such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art.

The term "conductor" is understood to include semiconductors, and the term "insulator" or "dielectric" is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The Abstract is provided to comply with 37 C.F.R. §1.72 (b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

What is claimed is:

1. A process, comprising:
    forming a spin-on film liquid topography upon a semiconductive substrate;
    imposing a solvent vapor at an overpressure on the spin-on film liquid topography;
    imposing sonic radiation pressure onto the spin-on film liquid topography to alter the liquid topography; and
    moving a mounting substrate, to which a source of the sonic radiation pressure is attached, in an eccentric oscillatory motion in a plane parallel to the semiconductor substrate while imposing the sonic radiation pressure.

2. The process of claim 1, wherein imposing sonic radiation includes imposing ultrasonic radiation pressure from a broadcasting head disposed above the spin-on liquid film.

3. The process of claim 1, wherein moving the mounting substrate includes moving the mounting substrate such that a path travelled by the source intersects a path travelled by another source attached to the mounting substrate.

4. The process of claim 1, wherein imposing sonic radiation pressure on the liquid topography includes broadcasting from a source arranged in an array with other sources of sonic radiation pressure.

5. The process of claim 1, wherein imposing sonic radiation pressure on the liquid topography includes broadcasting from plurality of sources while moving the plurality of source relative to the liquid topography such that the broadcasting is conducted in a phased manner.

6. The process of claim 1, wherein imposing sonic radiation pressure on the liquid topography includes:

broadcasting from a plurality of sources affixed in a substantially planar and parallel array relative to the semiconductive substrate; and moving the plurality of sources relative to the liquid topography.

7. The process of claim 1, wherein imposing sonic radiation pressure on the liquid topography includes:

broadcasting from a plurality of sources affixed in a substantially planar and parallel array relative to the semiconductive substrate, wherein each source has a characteristic diameter broadcast head; and oscillating the plurality of sources relative to the liquid topography such that some of the source characteristic diameter broadcast heads are moved to overlap a previous position of an adjacent broadcast head.

8. The process of claim 7, wherein oscillating the plurality of sources includes eccentric moving of the plurality of sources relative to the liquid topography.

9. The process of claim 1, further including forming the spin-on film by spraying spin-on film material under ultrasonic ejection pressure.

10. The process of claim 1, further including:

forming the spin-on film by spraying spin-on film material under ultrasonic ejection pressure; and broadcasting the sonic radiation pressure from a source arranged in a array with other sources of sonic radiation pressure such that the source and the other sources are activated according to an activation pattern.

11. The process of claim 1, wherein imposing sonic radiation includes imposing megasonic radiation pressure from a broadcasting head disposed above the spin-on liquid film.

12. A process, comprising:

forming a spin-on film liquid topography upon a semiconductive substrate;

imposing sonic radiation pressure from a source onto the spin-on film liquid topography to alter the liquid topography while eccentrically moving the source relative to the liquid topography by moving a mounting substrate, to which the source of the sonic radiation pressure is attached, in an eccentric oscillatory motion in a plane parallel to the semiconductor substrate; and imposing a solvent vapor at an overpressure on the spin-on film liquid topography.

13. The process of claim 12, wherein forming the spin-on film liquid topography is carried out in a tool, wherein imposing the solvent vapor at an overpressure includes imposing a solvent vapor at an overpressure exceeding a dissolved solvent vapor pressure in the spin-on film by a factor of between about 1.01 and 2.

14. The process of claim 12, wherein forming the spin-on film liquid topography is carried out in a tool, wherein the spin-on film comprises a spin-on glass, and wherein imposing a solvent vapor at an overpressure includes flushing the tool with a solvent vapor prior to forming the spin-on film.

15. The process of claim 12, wherein forming the spin-on film liquid topography is carried out in a tool, wherein the spin-on film comprises a spin-on solder paste, and wherein the imposing a solvent vapor at an overpressure includes flushing the tool with a solvent vapor prior to forming the spin-on film.

16. The process of claim 12, wherein forming the spin-on film liquid topography is carried out in a tool, wherein the spin-on film comprises a spin-on photoresist, and wherein the imposing a solvent vapor positive pressure includes flushing the tool with a solvent vapor prior to forming the spin-on film.

17. The process of claim 12, wherein imposing sonic radiation includes imposing from a broadcasting head disposed at least one of above or below the spin-on liquid film.

18. The process of claim 12, wherein the semiconductive substrate is moved laterally as the source is moved eccentrically.

19. The process of claim 12, wherein imposing sonic radiation includes imposing ultrasonic radiation pressure from a broadcasting head disposed above the spin-on liquid film.

20. The process of claim 12, wherein imposing sonic radiation includes imposing megasonic radiation pressure from a broadcasting head disposed above the spin-on liquid film.

21. A process, comprising:

forming a spin-on film liquid topography upon a semiconductive substrate;

imposing a spin-on liquid solvent overpressure upon the spin-on film liquid; and imposing sonic radiation pressure onto the spin-on film liquid topography to alter the liquid topography, wherein imposing the sonic radiation pressure includes modulating at least one of frequency or amplitude of an acoustic wave emanating from one or more sources imposing the sonic radiation pressure, the one or more sources attached to a mounting substrate, the mounting substrate moving in an eccentric oscillatory motion in a plane parallel to the semiconductive substrate, while imposing the sonic radiation pressure.

22. The process of claim 21, wherein modulating includes modulating using a frequency with a uniform pulse.

23. The process of claim 21, wherein modulating includes modulating using a frequency with an asymmetrical pulse.

24. The process of claim 21, wherein modulating includes modulating amplitude to alter the spin-on film topography at a boundary layer between the spin-on film and head space thereabove.

25. The process of claim 21, wherein modulating includes modulating from a broadcasting head disposed at least one of above or below the spin-on film.

26. The process of claim 21, wherein imposing sonic radiation includes imposing ultrasonic radiation pressure from a broadcasting head disposed above the spin-on liquid film.

27. The process of claim 21, wherein imposing sonic radiation includes imposing megasonic radiation pressure from a broadcasting head disposed above the spin-on liquid film.

* * * * *

UNITED STATES PATENT AND TRADEMARK OFFICE
CERTIFICATE OF CORRECTION

PATENT NO.         : 8,282,999 B2
APPLICATION NO.    : 12/098124
DATED              : October 9, 2012
INVENTOR(S)        : Nishant Sinha et al.

Page 1 of 1

It is certified that error appears in the above-identified patent and that said Letters Patent is hereby corrected as shown below:

In column 6, line 59, In Claim 4, delete "a" and insert -- the --, therefor.

In column 6, line 63, In Claim 5, delete "from plurality" and insert -- from a plurality --, therefor.

In column 6, line 63, In Claim 5, delete "source" and insert -- sources --, therefor.

In column 7, line 26, In Claim 10, delete "from a" and insert -- from the --, therefor.

In column 7, line 27, In Claim 10, delete "a" and insert -- an --, therefor.

In column 8, line 15, In Claim 18, delete "12,wherein" and insert -- 12, wherein --, therefor.

Signed and Sealed this
Eighteenth Day of December, 2012

David J. Kappos
*Director of the United States Patent and Trademark Office*